United States Patent [19]
Saito et al.

[11] Patent Number: 5,202,906
[45] Date of Patent: Apr. 13, 1993

[54] FREQUENCY DIVIDER WHICH HAS A VARIABLE LENGTH FIRST CYCLE BY CHANGING A DIVISION RATIO AFTER THE FIRST CYCLE AND A FREQUENCY SYNTHESIZER USING SAME

[75] Inventors: Shigeki Saito, Yokohama; Hiroshi Suzuki, Yokosuka; Yoshiaki Tarusawa, Yokohama, all of Japan

[73] Assignee: Nippon Telegraph and Telephone Company, Tokyo, Japan

[21] Appl. No.: 137,129

[22] Filed: Dec. 23, 1987

[30] Foreign Application Priority Data

Dec. 23, 1986 [JP] Japan .................. 61-305253
May 22, 1987 [JP] Japan .................. 62-123731

[51] Int. Cl.$^5$ .................. H03L 7/18; H03K 21/36
[52] U.S. Cl. .................. 331/14; 377/44; 377/47; 377/52; 328/134; 328/155; 331/1 A; 331/25
[58] Field of Search .................. 377/43, 47, 48, 50, 377/52, 107, 110; 331/1 A, 14, 25; 328/134, 135

[56] References Cited

U.S. PATENT DOCUMENTS

| | | | |
|---|---|---|---|
| 3,714,589 | 1/1973 | Lewis | 377/43 |
| 4,053,739 | 10/1977 | Miller et al. | 377/52 |
| 4,115,687 | 9/1978 | Boese et al. | 328/48 |
| 4,184,068 | 1/1980 | Washburn | 377/110 |
| 4,325,031 | 4/1982 | Ooms et al. | 377/107 |
| 4,357,527 | 11/1982 | Kojima | 377/52 |
| 4,468,797 | 8/1984 | Shin | 377/52 |
| 4,516,083 | 5/1985 | Turney | 331/25 |
| 4,558,457 | 12/1985 | Tabata | 377/107 |
| 4,625,180 | 11/1986 | Itaya et al. | 331/25 |
| 4,667,169 | 5/1987 | Matsuura et al. | 331/25 |
| 4,679,004 | 7/1987 | Takahara et al. | 331/14 |
| 4,679,005 | 7/1987 | Tatani | 331/25 |
| 4,743,864 | 5/1988 | Nakagawa et al. | 331/14 |
| 4,745,371 | 5/1988 | Haino | 331/1 A |
| 4,754,163 | 6/1988 | Aue et al. | 377/110 |
| 4,777,655 | 10/1988 | Numata et al. | 331/14 |
| 4,812,783 | 3/1989 | Honjo et al. | 331/25 |

FOREIGN PATENT DOCUMENTS

| | | | |
|---|---|---|---|
| 2128056 | 10/1972 | France | |
| 0066434 | 4/1983 | Japan | 331/14 |
| 1333534 | 10/1973 | United Kingdom | |

OTHER PUBLICATIONS

Rohde, Ulrich L.: "Digital PLL Frequency Synthesizers Theory and Design", pp. 276-280, Prentice-Hall, Inc., 1983.

Primary Examiner—William L. Sikes
Assistant Examiner—Tai V. Duong
Attorney, Agent, or Firm—Cushman, Darby & Cushman

[57] ABSTRACT

A frequency division scheme which offsets for a phase lag produced on initial power-on is described. A division ratio of a programmable counter is initially set at a first division ratio at the time of releasing the programmable counter from its reset state. When the first division cycle is complete, the division ratio is reset to its steady state value. Thus, a delay equivalent to the phase lag is produced. A frequency synthesizer is also proposed where the division ratio is set, and a phase difference is detected. Reset signals are continually set while the phase difference is changed. This cycle is continued until the phase difference is reduced to one cycle of the input signals or less.

3 Claims, 16 Drawing Sheets intermittent operation          PRIOR ART

PRIOR ART convention variable frequency divider reset operation of the programmable counter phase error of the programmable counter phase detector input and output of the phase detector

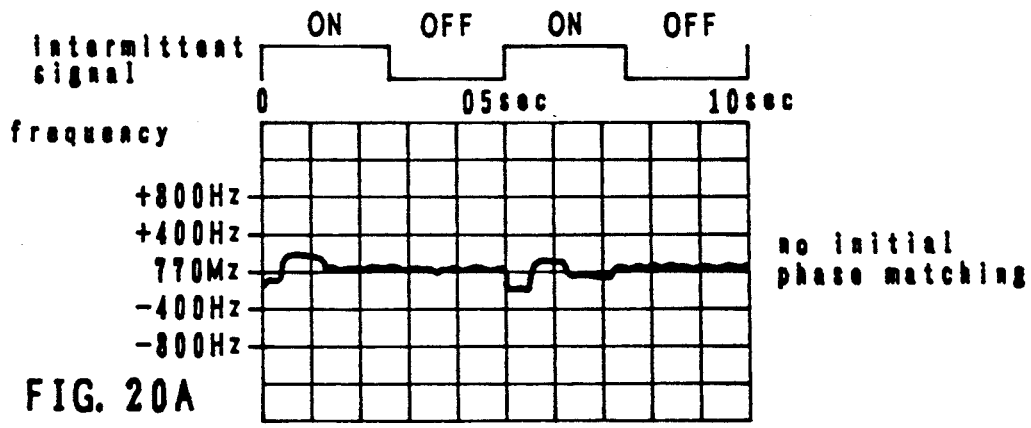
FIG. 20A
FIG. 20B
frequency changing in intermittent controlled operation (ON/OFF=1/1)
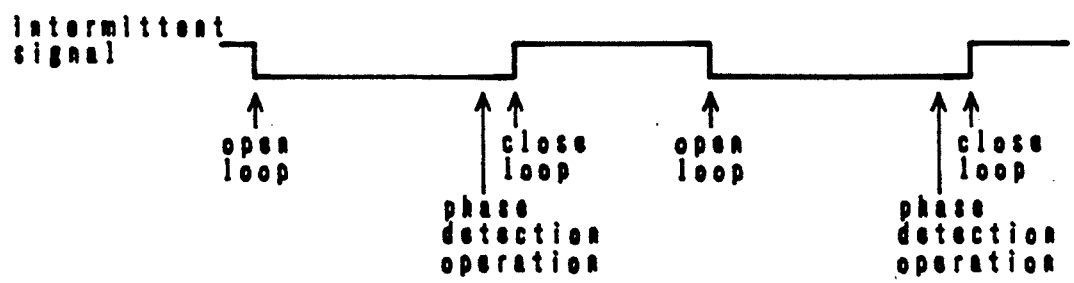
FIG. 21

FREQUENCY DIVIDER WHICH HAS A VARIABLE LENGTH FIRST CYCLE BY CHANGING A DIVISION RATIO AFTER THE FIRST CYCLE AND A FREQUENCY SYNTHESIZER USING SAME

BACKGROUND AND SUMMARY OF THE INVENTION

This invention relates to a frequency synthesizer to be used in mobile radio communications, satellite communications, terrestrial microwave communications, and other such radio equipment. More particularly, this invention relates to a frequency synthesizer which operates intermittently to reduce power consumption, but yet which rapidly phase-locks every time power is restored. This invention further relates to a programmable frequency divider used in a frequency synthesizer and more particularly to a programmable frequency divider in which internal conditions thereof can be preset.

Reduced power consumption is a critical necessity in portable telephone sets and other mobile radio transmitter/receivers. The reduction of power consumption for the frequency synthesizers used in such sets is a particularly important challenge. It is desirable to reduce power consumption by both optimizing the circuit structure (e.g., using low power consumption devices), and also by optimizing the circuit operation. One such possible optimization is by operating the circuit intermittently, known as intermittent operation.

The intermittently controlled frequency synthesizers of the prior art, however, have operated poorly. These devices fluctuate in frequency, whenever the power supply is intermittently switched ON/OFF.

Various circuits have been proposed to suppress such fluctuations. These prior art circuits, while they adequately control frequency fluctuations, have not been effective in intermittently controlling the phase-lock of the system. Such an operation will be described hereinafter.

FIG. 1 is a block diagram which shows a basic structure of a prior art intermittent-operation frequency synthesizer.

As shown in FIG. 1, voltage controlled oscillator (abbreviated as VCO) 1 has a frequency control input CTL and an output Fout, produced at a frequency proportional to the voltage of control input CTL. This output is freqency-divided by variable frequency divider 2. Phase comparator 4 compares the phase of the output signals from frequency divider 2 with the phase of the output signals from a reference signal oscillator 3. A signal proportional to the phase difference is output from phase comparator 4, is smoothed by a loop filter 5, and inputted as the voltage control CTL to VCO 1.

Such a construction uses a phase-locked loop (PLL) to minimize the signal proportional to the phase difference, so as to obtain output signals of a relatively stable frequency from the voltage controlled oscillator.

Such an intermittent operation circuit can be controlled in two ways. A first way is called Intermittent PLL operation. According to Intermittent PLL operation, the voltage controlled oscillator (VCO) 1 is maintained in operation at all times. A power source switch 9 (SW in FIG. 1) is controlled by a control circuit 8 such that it intermittently supplies power from the power source 7 to other circuits. A second method of control is by intermittent Oscillation Operation. In this method, the controlling circuit 8 controls the power source switch 9 so as to intermittently supply power to all of the circuits, including VCO 1. Thus VCO 1 is turned on and off along with all other structures.

The controlling methods for both methods are described with reference to FIG. 2.

When the power from power supply 7 is removed from respective circuits, the output signals from phase comparator 4 are blocked by a switch circuit 6, which is provided between the phase comparator and the loop filter 5 and controlled by control circuit 8. Loop filter 5 includes a charging circuit and latches the controlling voltage CTL. The voltage stored in loop filter 5 is continually supplied to VCO 1. The power supply is then suspended for a predetermined period of time. If the power supply to circuits other than VCO 1 are suspended during this time, this becomes an intermittent PLL operation. If the power supply to all the circuits, including VCO 1, are suspended, this becomes an intermittent oscillation operation.

When the power supply is resumed, the switching circuit 6 is closed, to once again transmit the signals from the phase comparator 4 to the loop filter 5. If there is a difference in phase between the output signals from the variable frequency divider 2 and the reference signal oscillator 3, the controlling voltage CTL to VCO 1 will fluctuate in proportion thereto, when switching circuit 6 is closed.

Therefore, before closing switching circuit 6, it is necessary to adjust the phase of the output signals from the variable frequency divider 2 to coincide with the phase of the output signals from reference signal oscillator 3. This can be achieved by two techniques. One technique requires detection of a coincidence in the phases between the two signals, and closes the switching circuit 6 only when the phase coincidence is detected. The other technique actively causes the phases to coincide with each other by using a phase control circuit, then closes switching circuit 6 once the phases coincide.

It has been found to be difficult to detect a coincidence in phase using the above-discussed first technique, however. Therefore, a predetermined allowable phase difference has been conventionally allowed, to facilitate signal detection. For example, the phases can be considered as coincident within an allowable difference of, for instance, 6 sec., in a 800 MHz frequency synthesizer (with a phase comparator reference frequency in a phase comparator of 25 kHz).

The second technique uses control circuit 8 to produce a reset signal to variable frequency divider 2, synchronized with an edge of the output signal from reference oscillator 3 to start the dividing operation. As the phase difference in this case is equivalent to one cycle of the input signals, it becomes approximately 1.3 nsec in a 800 MHz frequency synthesizer. The method, however, inevitably adds a delay to the phase difference, due to the inherent delays of the control circuit 8. For instance, gate propagation delays (10–100 ns per gate) may cause this inherent delay.

A programmable frequency divider suitable for use in the frequency synthesizer will now be described in more detail.

FIG. 3 is a block diagram which shows the basic structure of a programmable frequency divider. This divider comprises a resettable programmable counter 21, used to divide by a programmable ratio, and a division ratio data generator 22.

FIGS. 4 and 5 are time charts showing the resetting operation of programmable counter 22. If a division ratio n is set in advance, programmable counter 22 begins frequency dividing using the frequency division ratio n at time 404, after the reset signal is removed at time 402. Thus, the operation of this circuit is equivalent to the operation of a standard programmable counter. If, for instance, as shown in FIG. 4, the division ratio n is 4, programmable counter 22 outputs a low level only after counting 0, 1, 2,—when the counted value becomes 3. Programmable counter 22 outputs a high level at all other times except when reset. While programmable counter 22 is being reset, the output level is low.

As can be seen from FIG. 4, there is a delay time which elapses from the release of the reset signal at time 402 until time 404 when the dividing operation is actually started. This delay time is equivalent to approximately one cycle of the input clock.

When the clocks are of an extremely high speed, however, there is a longer delay between the removal of the reset signal and the start of counting, due to propagation delays, instruction times and the like. FIG. 5 shows that this delay time between release of reset at time 502 and counting initiation at time 504, may sometimes extend longer than one input clock cycle before the initiation of the dividing operation. This is an especially difficult problem in gigahertz applications, where the clock cycles are in the order of magnitude of nanoseconds (ns).

As shown in the time chart of FIG. 6, frequency division may be initiated with a higher frequency clock, synchronized with the reference signal. If it is desired to phase-lock the frequency dividing signal with the phase of the reference signal, the above mentioned delay time becomes a phase-error. The phase of a frequency divided output can be synchronized by using a function known as a preset function. This preset function can arbitrarily set internal conditions when the frequency dividing operation starts, to initiate a division operation with a predetermined phase.

FIGS. 7A and 7B show time-chart examples of a preset counter and will be used to compare the reset function with the preset function.

FIG. 7A shows the reset function in use. The frequency divider output stays at a low level while reset, and provides pulses of a 50% duty ratio after the reset is released. FIGS. 7A and 7B show the reset signal being released at a first time 702. FIG. 7A begins counting after an elapse of a delay time 704. The counting begins at a lowest possible number (0) and then counts to (3). divided by ½ assumes an opposite state at time 706. This output signal is thus the clock divided by 8. However, the phase of this signal is dependent on the delay time 704, and essentially begins a random time after the reset signal ends. Therefore, if the reset signal is synchronized with a reference signal, the output will be phase-offset from this reference signal. FIG. 7B shows the preset function being used. For instance, when the preset value is 1, the frequency divider output is at a high level corresponding to the value when the preset is ON, and starts counting clocks from the value 1. Since the counting starts from a value 1 instead of the value 0, there is a phase offset built-in to this system. When the reset signal goes low at time 702, the output begins immediately counting. The first count signal is a (2), which is produced at time 708. This first counting signal of (2) is substantially synchronized with the (0) of FIG. 7A. It can therefore be seen that the signal of FIG. 7B is phase offset by two clock cycles. Also, the output remains at "1" during reset.

The technique shown in FIG. 7B can be used to synchronize the frequency divider with a reference when the preset is released to resume the frequency dividing operation. To do this, the internal state is preset in advance, deviated by a number of the input clock cycles equivalent to the delay. When the preset is released, the output from the frequency divider becomes synchronized with the reference signal with a phase difference within one cycle of the input clock cycle.

FIG. 8 is a block diagram which shows the basic structure of a programmable frequency divider using a pulse swallowing type programmable counter. This counter includes division ratio data generator 22, and pulse swallowing type programmable counter 25. This device has programmable counter 23 incorporating two counters respectively denoted A and B, and a pre-scaler 24 which can switch the division ratio between the ratios P and P+1. The programmable counter 23 counts the output pulse form the pre-scaler 24 using counters A and B to simultaneously count this output.

The division ratio is initially set at P+1 at the pre-scaler 24.

It is assumed here that the division ratio of the counter A and of the counter B are a and b respectively, with b>a. The counter A therefore counts a number a of output pulses from the pre-scaler 24, and then outputs a pulse to the pre-scaler 24. This revises the division ratio from P+1 to P, and then suspends counting of counter A.

The counter B is simultaneously counting, and counts a number b of output pulses from the pre-scaler 24 before outputting a pulse. However, the number a of the pulses has been frequency divided by P+1 while the number (b − a) of pulses is frequency divided by P, since counter A revises the division after counting a pulse. The division ratio N is therefore expressed as below:

$$N = a(P+1) + (b-a)P = bP + a$$

Whenever the counter B outputs a pulse, counters A and B and pre-scaler 24 may be all reset. The division ratio of the pre-scaler 24 is therefore set again at P +1 (if reset). Therefore, this pulse swallowing type of programmable counter is generally used for frequency synthesizers of several tens of MHz or higher. When the frequency of the input clock is high, ¼ or ⅛ radio frequency fixed counters (RF-fixed counters) are generally provided at the stage prior to a programmable counter as a radio frequency-counter. In such a case, the division ratio inevitably becomes a multiple of 4 or 8, making fine precision frequency control difficult. However, if the frequency is not that high, this pulse swallowing method can divide frequency directly and change the frequencies in the whole system separately from each other.

Even in the case of pulse swallowing type programmable counters as described above, the phase of the output from the frequency divider can be, in principle, phase-locked with the reference signal by adding the aforementioned preset function.

However, it has proved extremely difficult in practice to add such a preset function to either of a variable frequency divider or to the pulse swallowing type programmable counter. Such a preset function is quite easy to add to fixed frequency dividers.

More particularly, in order to add a preset function to a pulse swallowing type programmable counter, the pre-scaler also requires a preset function. The addition of a preset function to a pre-scaler for a frequency as high as 1–3 GHz would, however, increase the operation speed and power consumption and thereby deteriorate performance.

Moreover, the programmable counter is typically already equipped with a preset function in order to construct a programmable frequency divider. Addition of another preset function would pose a difficulty and would require extra structure.

The present invention was conceived to eliminate these defects encountered in the prior art frequency synthesizers, and aims at providing a frequency synthesizer which can be set with a phase-lock for reformation of a phase-locked loop at an high speed and with minimum frequency fluctuation.

According to a first aspect of this invention, a preset function is provided on a variable frequency divider having a simple circuit structure. More particularly, the programmable frequency divider of this invention has a division ratio data generator to generate division ratio data and a programmable counter with a reset function to change the division ratio based on the data. A division ratio data latch circuit temporarily retains division ratio data, and a control circuit controls the trigger signals for the division ratio data latch circuit and the division ratio data from the data source so that the division ratio data can be changed. This division ratio is changed to be different in operation for the first cycle after the release of the reset signal than it is after the operation for the second cycle and thereafter. In other words, by simply changing the division ratio when the dividing operation starts, the equivalent of a preset function is added to a programmable frequency divider circuit.

The programmable frequency divider of this invention is unique and distinguishable from the circuits of the prior art. The division ratio data can be reset by detecting output signals from the programmable counter. The circuit, furthermore, has a division ratio for dividing operation in the first cycle after the reset is released, which is different from the division ratio for the dividing operation at the second cycle and thereafter.

The preset function is used, according to the present invention, to determine the initial phase of the output pulses of a programmable frequency divider, when the reset is initially released. The initial phase can be set in units of a cycle of an input clock. If the frequency of the system is high, the cycle of the input clock is short and the phase of the output pulses can thus be controlled with a finer precision. The propagation delay of the reset release signal due to passing several stages of gate circuitry can be offset by this aforementioned preset function.

The division ratio data for the first cycle operation may be chosen arbitrarily, to realize a function similar to the preset function very easily, using this structure.

If such a programmable frequency divider is used for a frequency synthesizer, the division ratio of the programmable frequency divider can be controlled after the release of the reset signal to offset the phase difference caused by the delays in the control circuit.

According to a second aspect of this invention, a frequency synthesizer produces a signal proportional to a phase difference between the phase of the output signals from the reference oscillator and the phase of the output signal from the variable frequency divider structure. This signal is used for blocking a control signal from being transmitted to a loop filter. The control voltage of the voltage controlled oscillator (VCO) which has been charged in the loop filter is therefore retained.

This signal is produced by a phase difference detection structure which detects the phase difference between the output signal from the reference oscillator and the output signal from the variable frequency divider.

The internal condition of the variable frequency divider can be reset. Upon detecting an edge of the output signals from the reference signal oscillator, the reset is released from the variable frequency divider conducting the dividing operation for the first cycle alone. A frequency dividing operation is conducted using the ratio N for a predetermined period at the second cycle and thereafter. A phase difference is detected by a phase detector between the N ratio output phase from the variable frequency divider and the output phase from the reference oscillator. The division ratio N is then set as $n_2$ for the variable frequency divider based on the result of the above detection.

A function which blocks the phase difference signal from a phase comparator is also provided, to latch the control voltage of the voltage controlled oscillator at a loop filter. The phase difference detection is repeated until the phase difference between the output signals from the reference oscillator and the output signals from the variable frequency divider becomes smaller than a reference value. A switching circuit is then connected to form a closed loop when the phase difference becomes below a predetermined value or immediately after the final phase difference detection.

The frequency synthesizer of this invention is uniquely characterized in that it uses a phase difference detection operation, and that it can control the phase difference between the output signals from the reference signal oscillator and the output signals from the variable frequency divider to be within a reference value.

The frequency synthesizer of this invention is constructed in a manner that the control voltage of the voltage controlled oscillator is retained in a loop filter. The division ratio n of the variable frequency divider is set to $n_1$ before closing of the loop in order to reset the internal condition of the variable frequency divider. An edge of the outputs or said reference oscillator is detected to release the reset of the variable frequency divider, to conduct dividing operation for the first cycle alone with the division ratio of $n_1$. The dividing operation is conducted with the ratio of N for the second cycle and thereafter, and the loop is closed immediately after the last of such operations. The phase difference between the output from the reference signal oscillator and the output from the variable frequency divider after division by the ratio N is detected by a phase detector during the N frequency dividing operation immediately after the reset release. The division ratio n is set to $n_2$ based on the result of the above detection and the variable frequency divider is reset again for the second phase detection. An operation similar to the first is repeated, until a time when the phase difference of the output from the variable frequency divider becomes smaller than the reference value. A closed loop is formed immediately after the final phase detection is conducted. Since the phase detection is conducted during the intermittent operation, the phase difference can be kept constantly under the reference value.

Therefore, irrespective of fluctuations in temperature and voltage, the synthesizer of this invention can constantly establish phase-lock of the loop, at a high speed and with minimal frequency fluctuation.

This invention therefore effectively allows intermittent operation of such a frequency synthesizer and therefore can achieve a reduction of power consumption in the frequency synthesizer.

This invention further permits fast channel switching by charging the control voltage of the voltage controlled oscillator into the loop filter, while the input from the phase comparator is being blocked from the loop filter. The division ratio N at the variable frequency divider is set corresponding to the frequency.

The frequency synthesizer of this invention can effectively reduce the power consumption of devices such as mobile radio communications, satellite communications, terrestrial microwave communications and other systems which operate with radio frequency. For instance, the invention synthesizer may be used in intermittently receiving in an NTT high capacity land mobile communication system, to extend the time available from the battery per one charge by a factor of 1.5 times. It can reduce power consumption by even a larger margin in a radio communication system of a smaller output power, such as office cordless phone systems. This invention method can switch channels at higher speed by charging the control voltage of the voltage controlled oscillator corresponding to another oscillation frequency at a loop filter, while blocking the input from the phase comparator from the loop filter and setting a division ratio of the variable frequency divider corresponding to the particular frequency. All of this can occur at high speeds.

All the control circuits according to this invention can be constructed with digital ICs, to facilitate large scale integration without the necessity of adjustment.

BRIEF DESCRIPTION OF THE DRAWINGS

An exemplary and presently preferred embodiment of the invention will be described in detail with reference to the accompanying drawings, wherein:

FIGS. 20A and 20B are views to show the result of frequency fluctuation during a test of intermittent operation; and FIG. 21 is a view to show control by repeatedly switching the power source of this invention embodiment of the frequency synthesizer.

DESCRIPTION OF THE PREFERRED EMBODIMENTS

Figure 9:
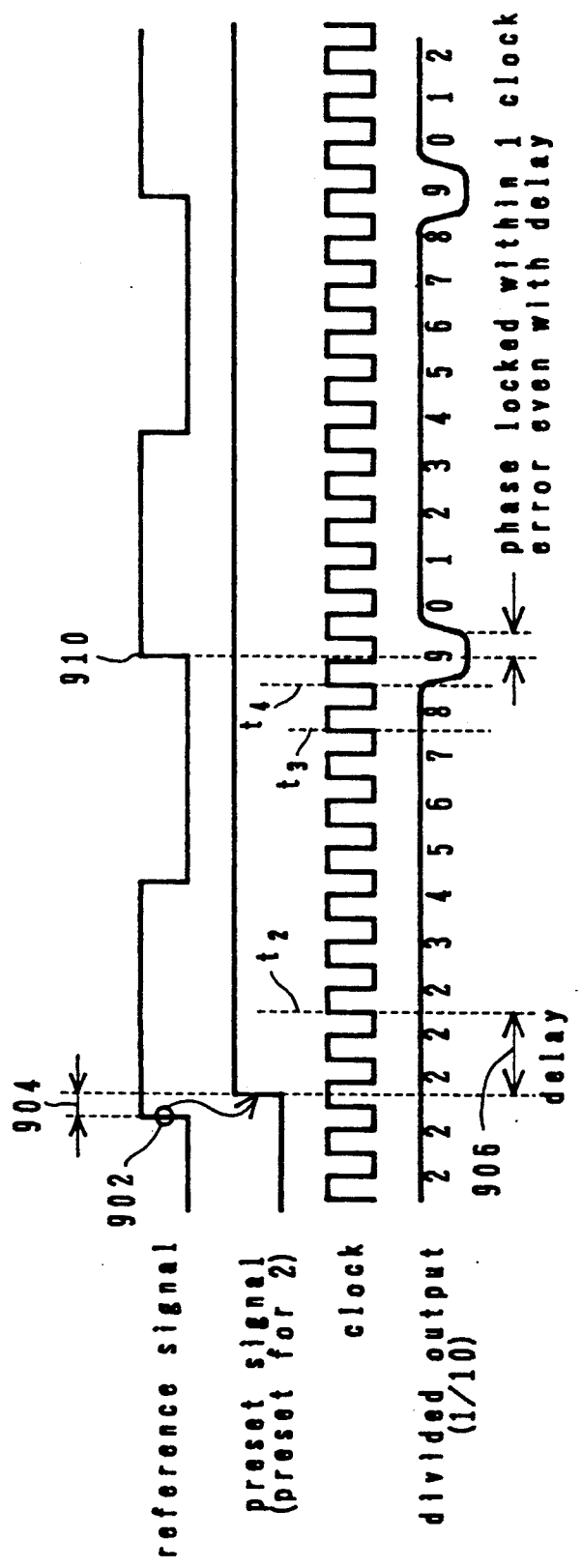
FIG. 9 is a timing chart to explain the preset operation according to this invention.

FIG. 9 is a timing chart to show the operation of a programmable frequency dividing circuit which is preset at a phase value of (2). This timing chart shows that in the second cycle and thereafter the operation reaches a steady-state condition, with a division ratio of 10. In order to ensure an accurate start-up condition, an appropriate preset value can be used to adjust the duration of time (the phase) before the circuit starts its normal dividing operation. This preset value can be arbitrarily set in units of clock cycles.

FIG. 9 shows how the preset function can be used to synchronize the divided output to be phased locked with the reference signal, even though there is an inherent propagation delay within this signal. FIG. 9 shows the reference signal with which it is desired to synchronize. This example is an attempt to synchronize the divided output with the rising edge of the reference signal as shown by point 902 in FIG. 9. Point 902 represents the initial point of the dividing operation. Therefore, upon the rising edge of the reference signal at point 902, the preset signal is initiated. After a first delay 904, the preset signal becomes active, presetting the counter. This first delay 904 will be typically due to propagation delays of gates and the like. A second delay 906 occurs after the preset signal becomes active before the divided output of the counter begins counting. Since this divided output is maintained at the value (2) during the time of preset, the first count value is the value (2).

This first count value of (2) occurs at the first time T2, as can be seen from FIG. 9. Similarly, the counter then counts through 3,4 . . . until the counter reaches 8 at time T3. At time T4, the counter reaches the count of 9. Since the counter is a divide by 10 counter, the divided output for the entire clock cycle for the count of 9 will be low, to indicate an active condition.

However, even though this initial period was delayed due to the two delays 904 and 906, the first divide by 10 cycle is still substantially phase-locked with rising edge 910 of the reference signal. That is, the count of 9 at the output of the counter occurs within one clock cycle of rising edge 910, even though the inherent propagation delays 904 and 906 exist in this circuit. By appropriately choosing the preset value, the initial divide by N cycle is still phase-locked with the reference signal, as described above. The present invention can also realize preset functions with different division ratios for the first cycle, as well as for the second cycle and thereafter.

Figure 10:
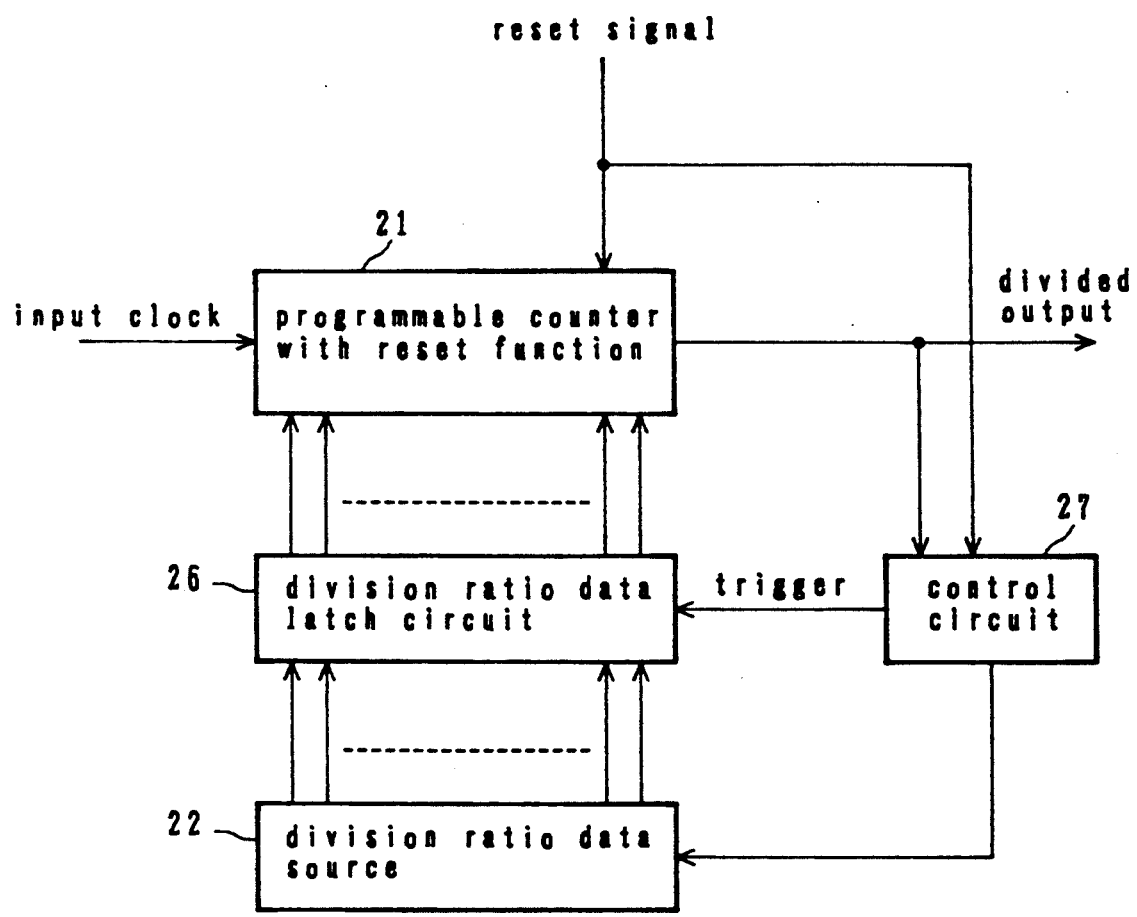
FIG. 10 is a block diagram of the first embodiment programmable frequency divider circuit of this invention.

FIG. 10 is a block diagram showing a first embodiment of the programmable frequency divider circuit of this invention. This embodiment includes programmable counter 21, which includes a reset function, and division ratio data generator 22. Counter 21 can typically be embodied by a 74161 type IC, of the standard TTL type, and generator 22 can be embodied by a multiple number of 74164's. A division ratio data latch circuit 26 latches the division ratio data output from the generator 22 and sends the data to programmable counter 21 when a trigger signal is received. Division ratio data latch 26 can be embodied by a multiple number of 74374's. A controlling circuit 27 controls the operation of this embodiment including sending the trigger signal, and can be, for instance, a personal computer of the type PC9800.

Figure 11:
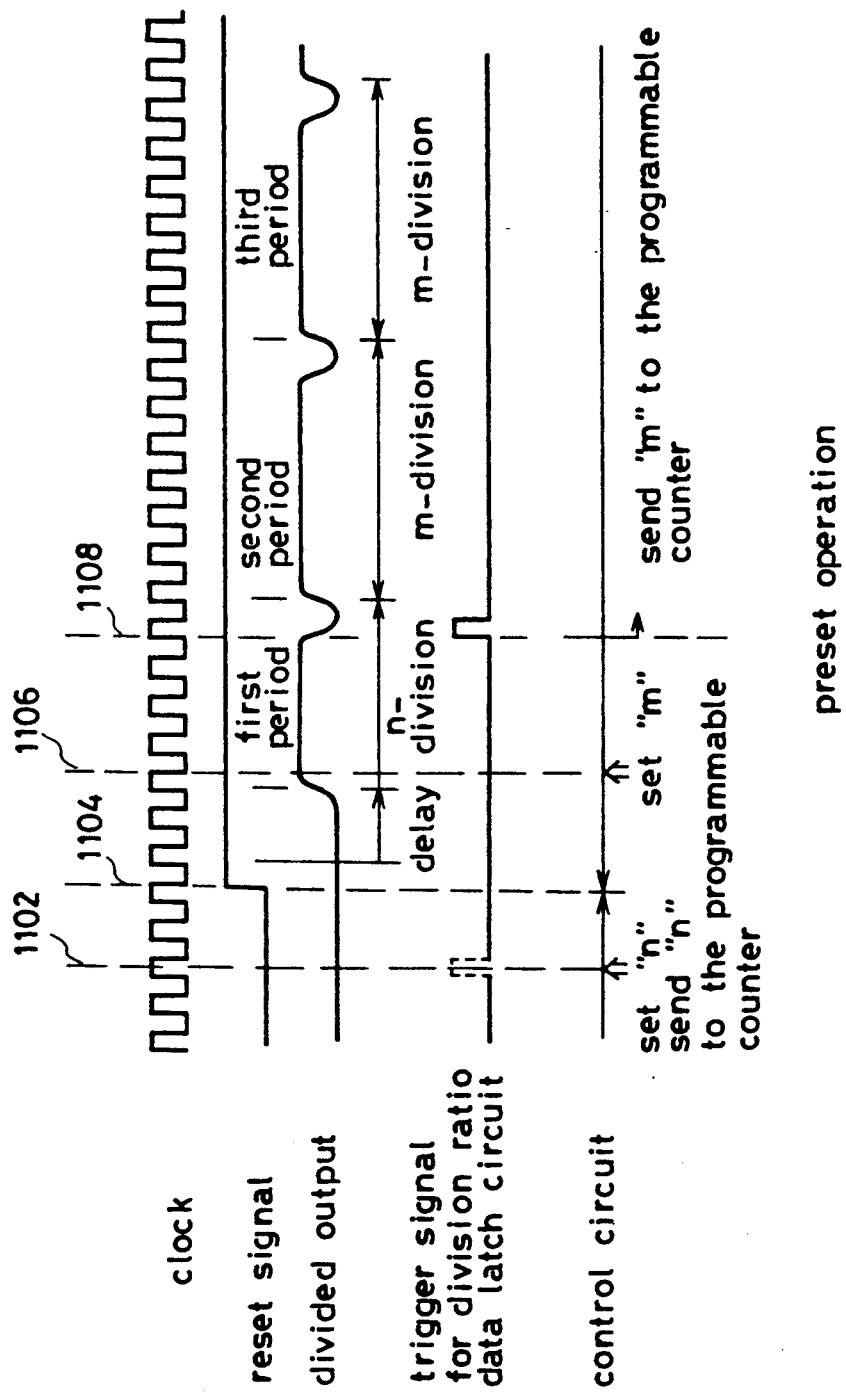
FIG. 11 is a timing chart to explain the preset operation of this embodiment.

FIG. 11 shows a timing chart of the operation of this first embodiment. The output from programmable counter 21 is at a low level during its reset condition, although a high level reset level could also be used. The initial division ratio n from ratio generator 22 is set into latch circuit 26 in response to the trigger signal at time 1102. The division ratio is set at n in the programmable counter 21 in response to this scenario.

When the reset is released at time 1104, a frequency dividing operation is started using the initial division ratio of n for its first cycle. In the meantime, while the frequency dividing by the initial ratio of m is being conducted, ratio generator 22 sets the next division ratio to the programmable counter at time 1106. The count of programmable counter subsequently reaches the value n at time 1108. The counting of the nth input clock produces a trigger signal at this time 1108, to be fed to the latch circuit 26. This trigger signal triggers the new division ratio m to be set to programmable counter 21, and the division ratio of the programmable counter 21 is thus changed to m within a cycle of the input clock. The frequency is therefore divided with the ratio m in the second cycle and thereafter.

The first cycle can therefore be made programmable by using the initial value n. The initial phase at the time of releasing the reset can be adjusted in units of input clock cycles by adjusting this initial value n. By using a different dividing ratio during this first cycle, the operation becomes functionally similar to the preset function described above with reference to FIG. 11. As in the preset function of FIG. 9, the number of counted pulses during the first cycle after a release of the reset is different from the number of counted pulses during subsequent cycles. FIG. 9 performs this operation by presetting an initial value into the counter. Counting begins at this initial value to use the same division ratio. In contrast, the structure of FIG. 10, as described in the timing chart of FIG. 11, changes the divide by ratio during this first cycle. Thus, a different number of pulses are counted during this first cycle as in the preset function of FIG. 9, yielding an operation which is functionally equivalent. The programmable counter 21 therefore has output signals which are equivalent to the preset function.

The latch circuit 26 temporarily stores the division ratio data and supplies the same to the programmable counter 21 in this embodiment. The data is supplied at a timing so as not to cause malfunctioning of the programmable counter 21. The latch circuit 26 is, however, not always necessary. For instance, the division ratio data generated from data generator 22 may be directly supplied to programmable counter 21 if the division ratio data is to be taken only when the reset state is released, or when a dividing operation for one cycle is completed.

Figure 12:
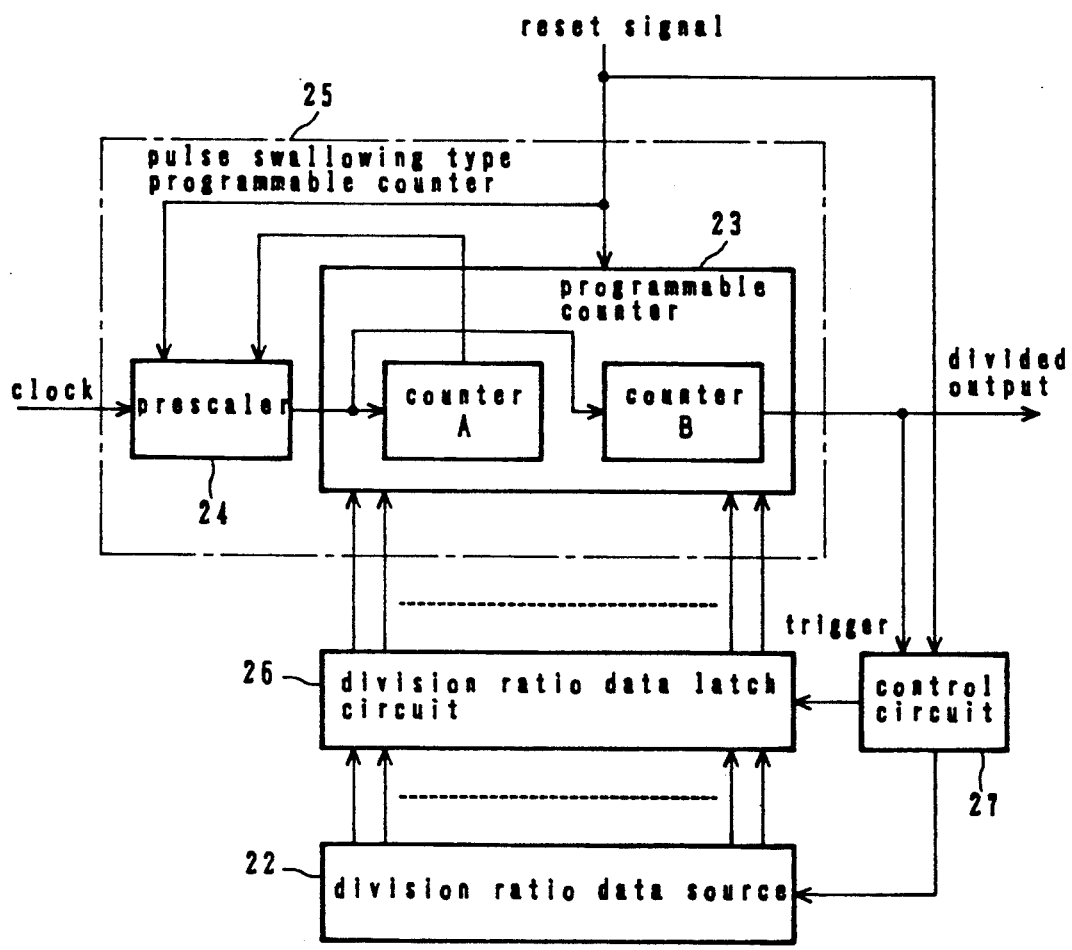
FIG. 12 is a block diagram of the second embodiment programmable frequency divider circuit of this invention.

FIG. 12 is a block diagram which shows a second embodiment of the programmable frequency divider of this invention.

Figure 8:
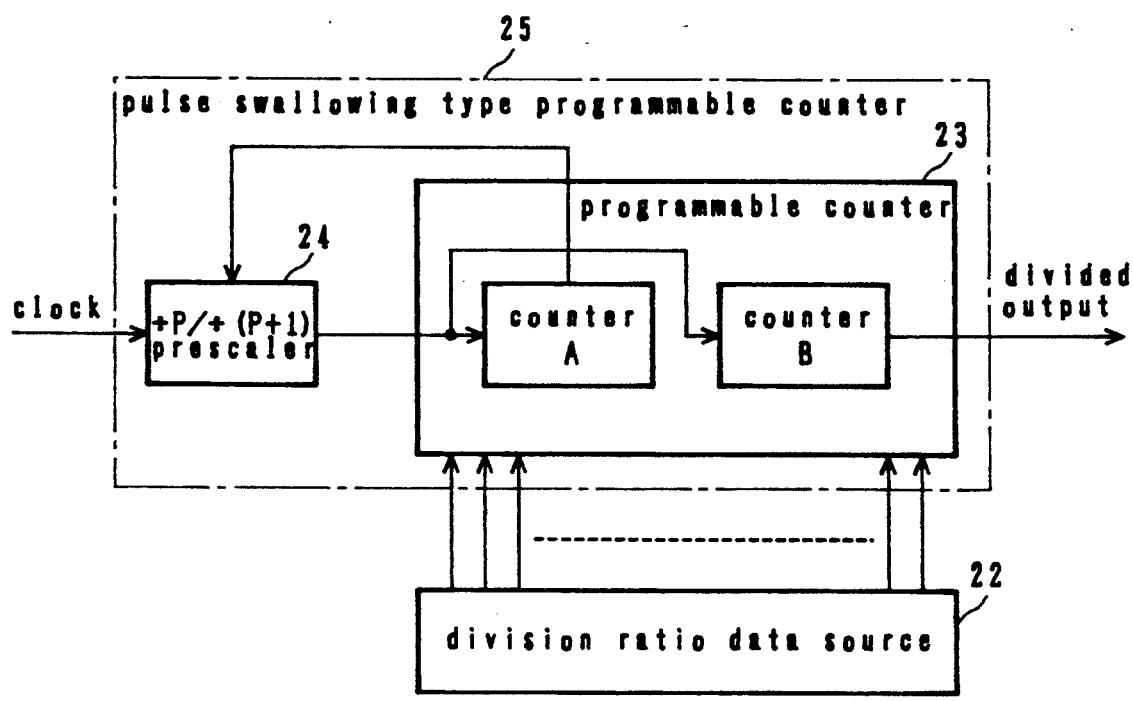
FIG. 8 is a block diagram to explain the basic structure of a pulse swallowing type programmable counter.

This second embodiment uses, instead of the programmable counter 21 with a reset function, a pulse swallowing type programmable counter 25 of the type discussed with reference to FIG. 8. This device is formed of programmable counter 23 which is a NEC μpD2833C, and prescaler 24 which is a NEC μpB566C. The pre-scaler 24 switches the division ratio between P and P+1, and programmable counter 23 has a reset function incorporating a counter A with a division ratio of a and a counter B with a division ratio of b. Pulse swallowing counters are described in more detail in WL Rohde "Digital PLL Frequency Synthesizers Theory and Design", Prentice-Hall (1983), at pages 276–280, the disclosure of which is incorporated by reference.

Figure 13:
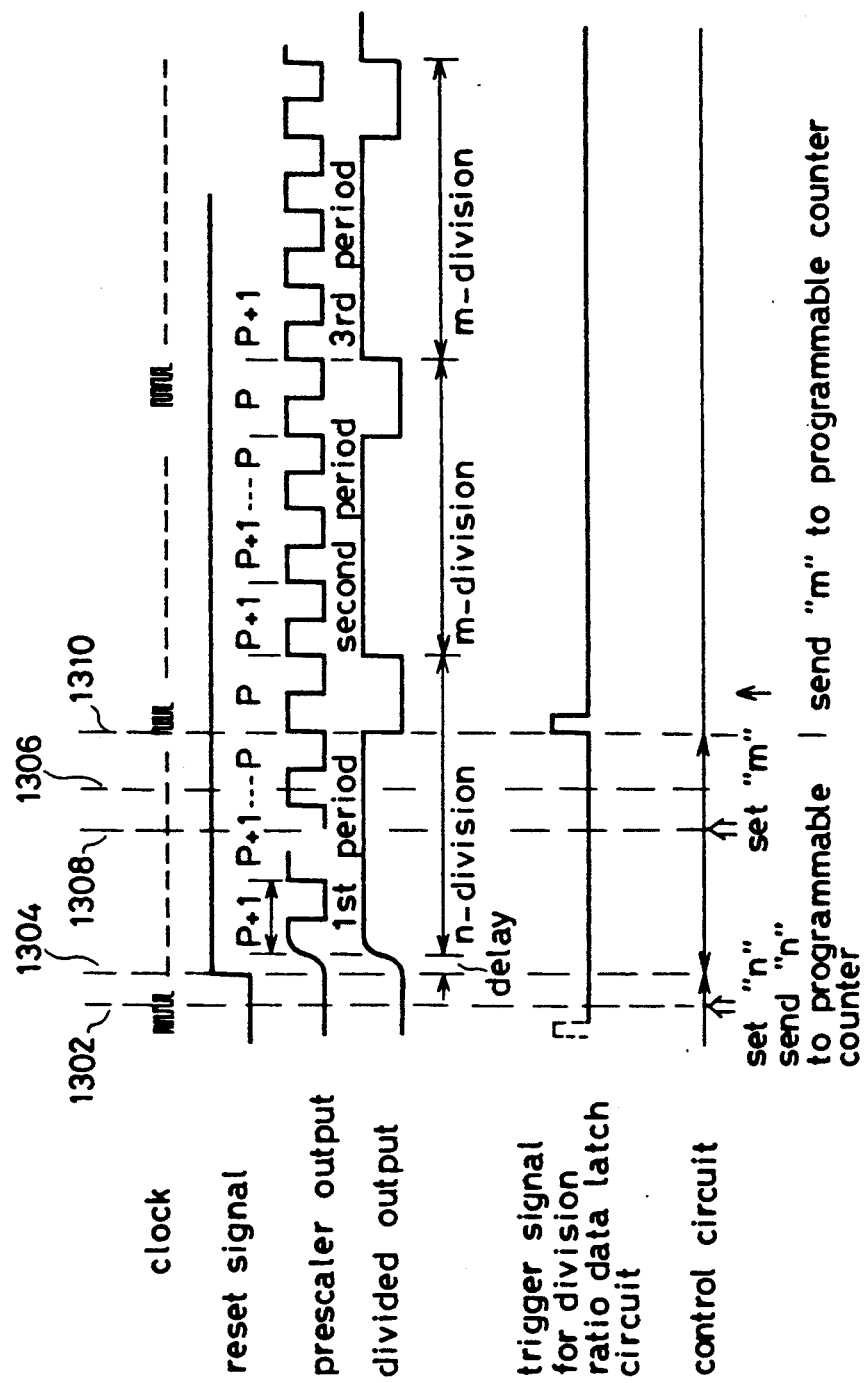
FIG. 13 is a timing chart to explain the preset operation of the second embodiment.

FIG. 13 shows a timing chart of the preset operation of this embodiment. When the pre-scaler 24 and the programmable counter 23 are reset simultaneously by the reset signal, the outputs from pre-scaler 24 and counter 23 are set at a low level, although a high level could also be used. During this reset period, at time 1302, the division ratio n is set by the data generator 22, in response to a trigger signal which is fed to latch circuit 26. This initiates the division ratio of pulse swallowing type programmable counter 25 to be set at n, and the division ratio of pre-scaler 24 to be simultaneously set at P+1.

More specifically, the counter A within the programmable counter 23 has the function of changing the division ratio of the pre-scaler 24 and does not affect the division ratio of the whole system. When counter 25 receives the division ratio data n from the latch circuit 26, the counter 25 adjusts the division ratio for the pre-scaler 24 and the counter B in a manner to make the division ratio of the system be the value n. Therefore, the latch circuit 26 may be the same circuit as the one used in the first embodiment.

When the reset is released at time 1304, the dividing operation is initiated. The pulse swallowing type programmable counter 25 divides the frequency for the first cycle by n according to the division ratios of counters A and B. Initially, counter A is set to a division ratio of $a_1$ while counter B is set to a division ratio of $b_1$. Counter A counts a1 pulses at a division ratio set by the pre-scaler of P+1. After counting the $a_1$ pulses, pre-scaler 24 changes the division ratio to P at time 1306. In the meantime, at time 1308, a new system division ratio of m is set to the outputs of division ratio data latch circuit 26. After counter B counts the number b₁, the divided output signal is produced at time 1310. This divided output signal produces a trigger signal to division ratio data latch circuit 26, in order to set the new system division ratio m to the programmable counter. This new division ratio is set to the counter within one cycle of the trigger pulse from pre-scaler 24. The pulse swallowing type programmable counter 25 divides using the division ratio m beginning at the second cycle and continuing thereafter.

By arbitrarily selecting the number n, it becomes possible to change the cycle of the dividing operation of the first cycle in the counter 25, to thereby adjust the initial phase in units of the clock cycles inputted from the pre-scaler 24 after the reset is released.

The allowable time from the initial trigger of the output for the first cycle until the change of the division ratio to m at the programmable counter 21 is within one division cycle of the input clocks in the first embodiment. In the second embodiment, on the other hand, the allowable time of the pulse swallowing type counter 25 is equivalent to one cycle of input clocks of the circuit 23 or a value equivalent to P+1 times of the input clock of the pre-scaler 24.

If the input clocks are identical in the first and second embodiments, therefore, the allowable time of the second embodiment becomes P+1 times as much as the first embodiment.

Similarly to the first embodiment, as the cycle of the dividing operation can be changed from the first cycle in the unit of clock cycle in this embodiment, it can achieve an effect similar to the preset function.

Figure 1:
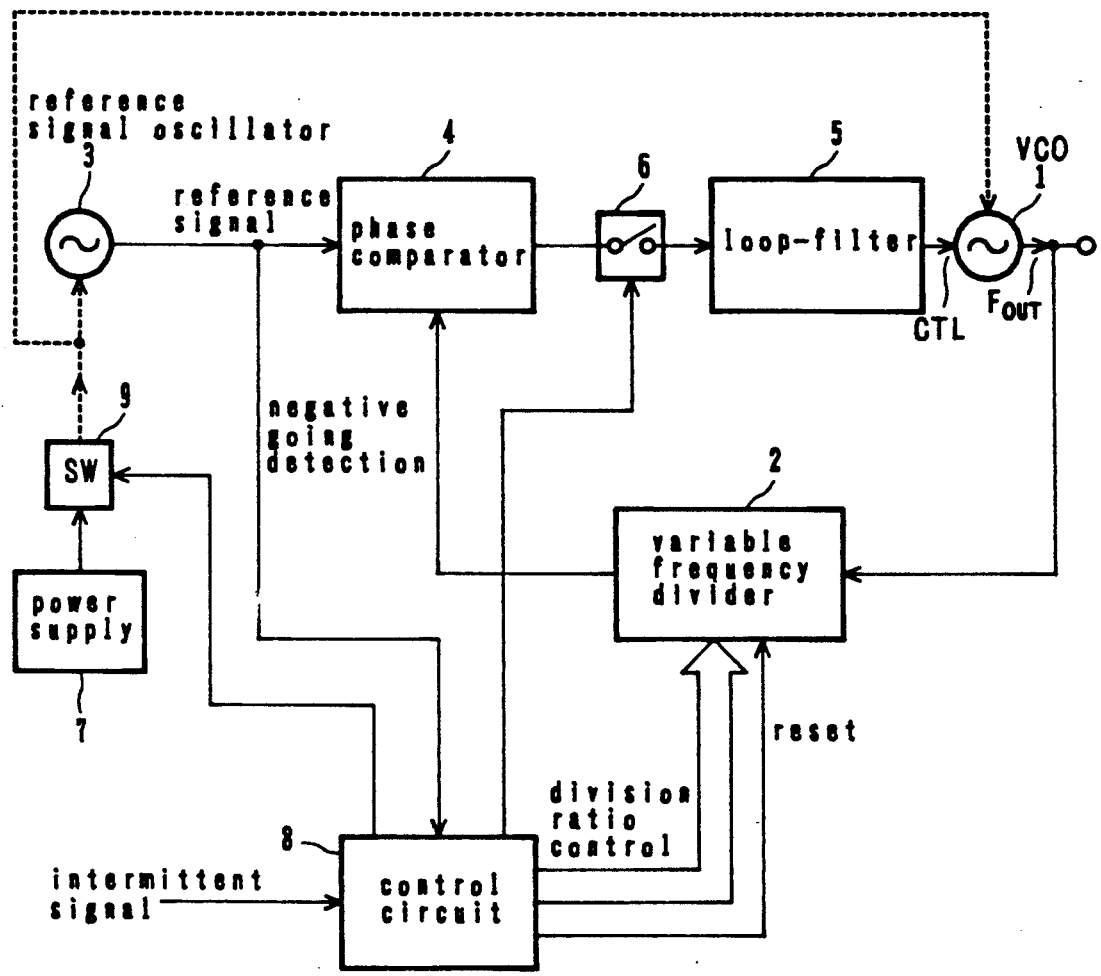
FIG. 1 is a block diagram to show the basic structure of a prior art frequency synthesizer used for intermittent operation.
Figure 2:
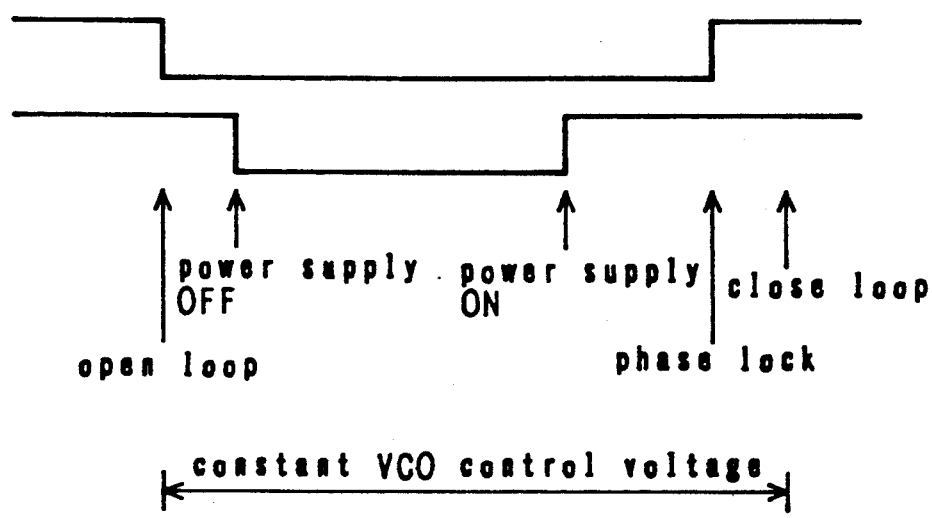
FIG. 2 is a chart to show the procedure for intermittent operation.
Figure 3:
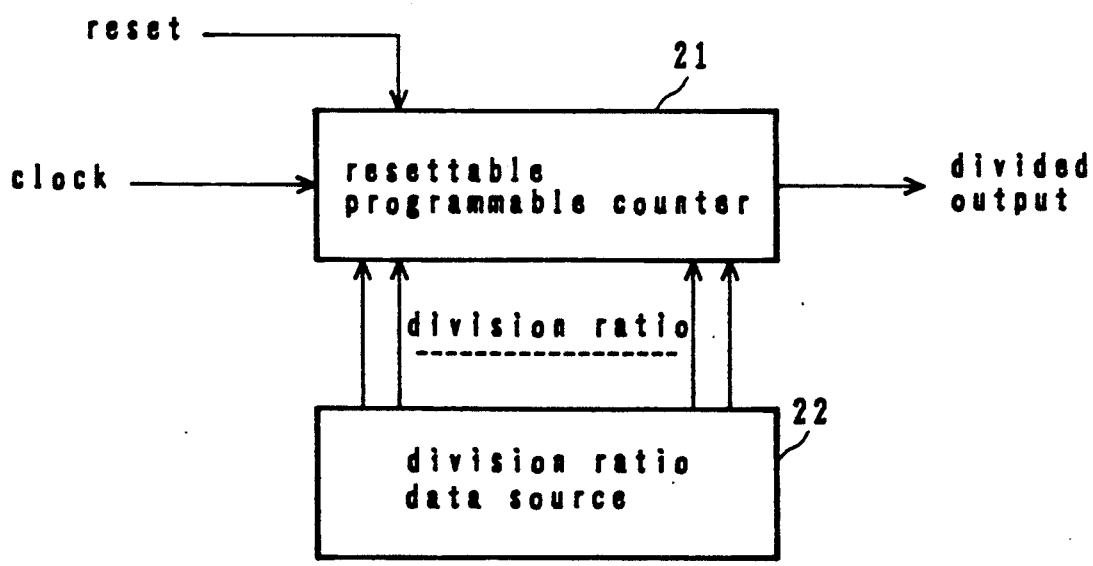
FIG. 3 is a block diagram to show the basic structure of a programmable frequency divider circuit.
Figure 4:
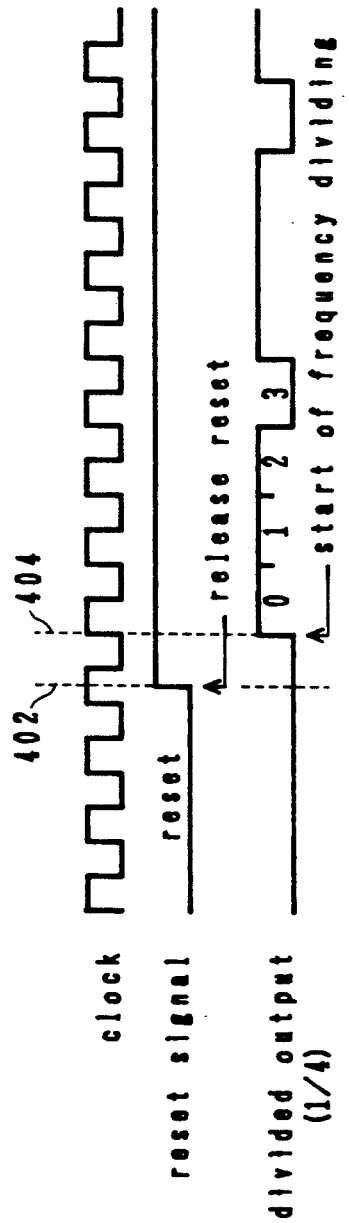
FIG. 4 is a timing chart of the basic reset operation of a programmable counter which has the reset function.
Figure 5:
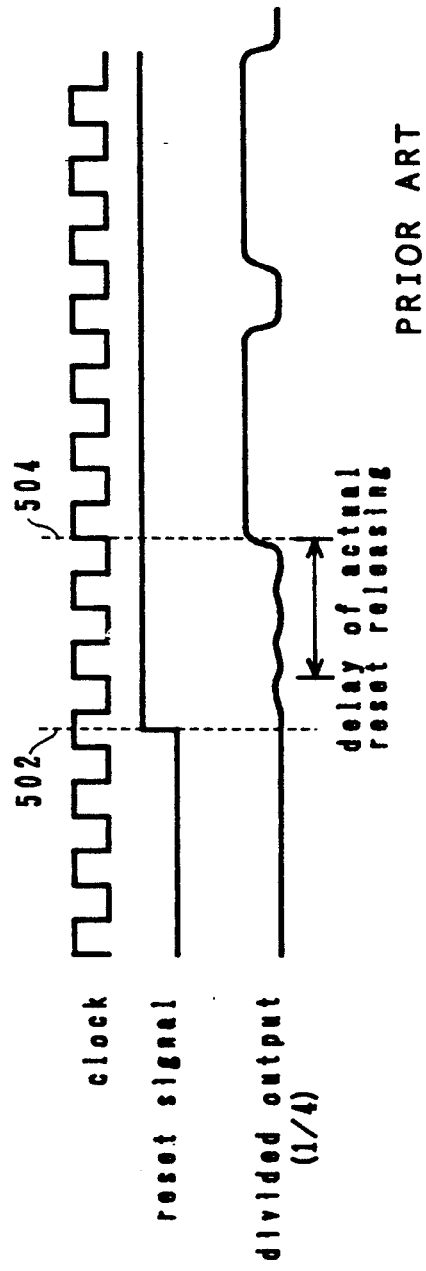
FIG. 5 is a timing chart to show the reset operation of a programmable counter which has a reset function and which is operated at high speed.
Figure 6:
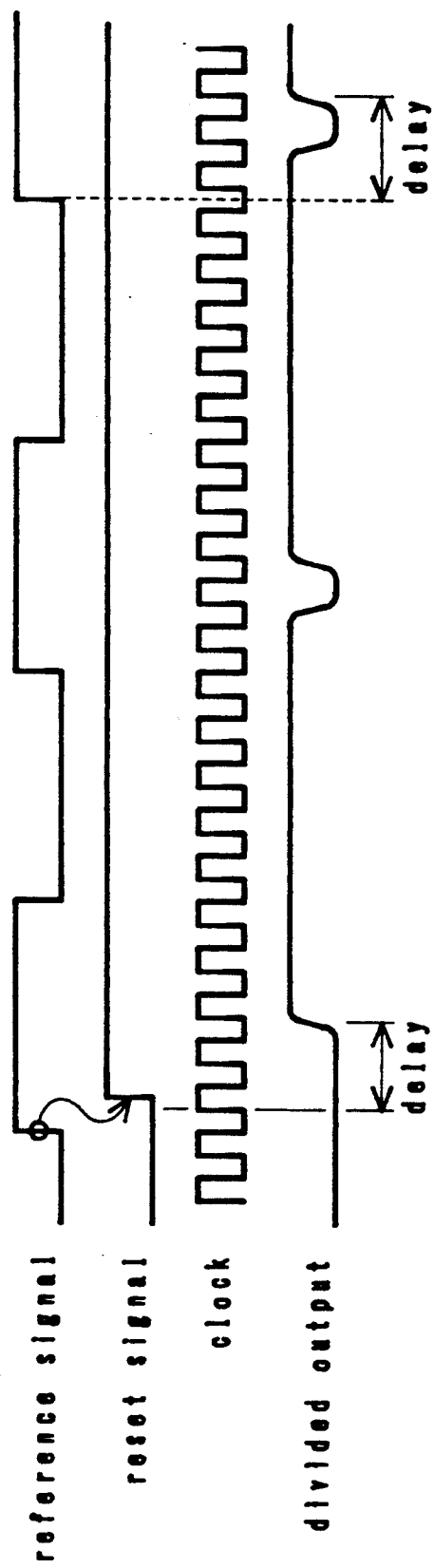
FIG. 6 is a timing chart to explain the synchronization difference of the programmable counter with the reset function.
Figure 7:
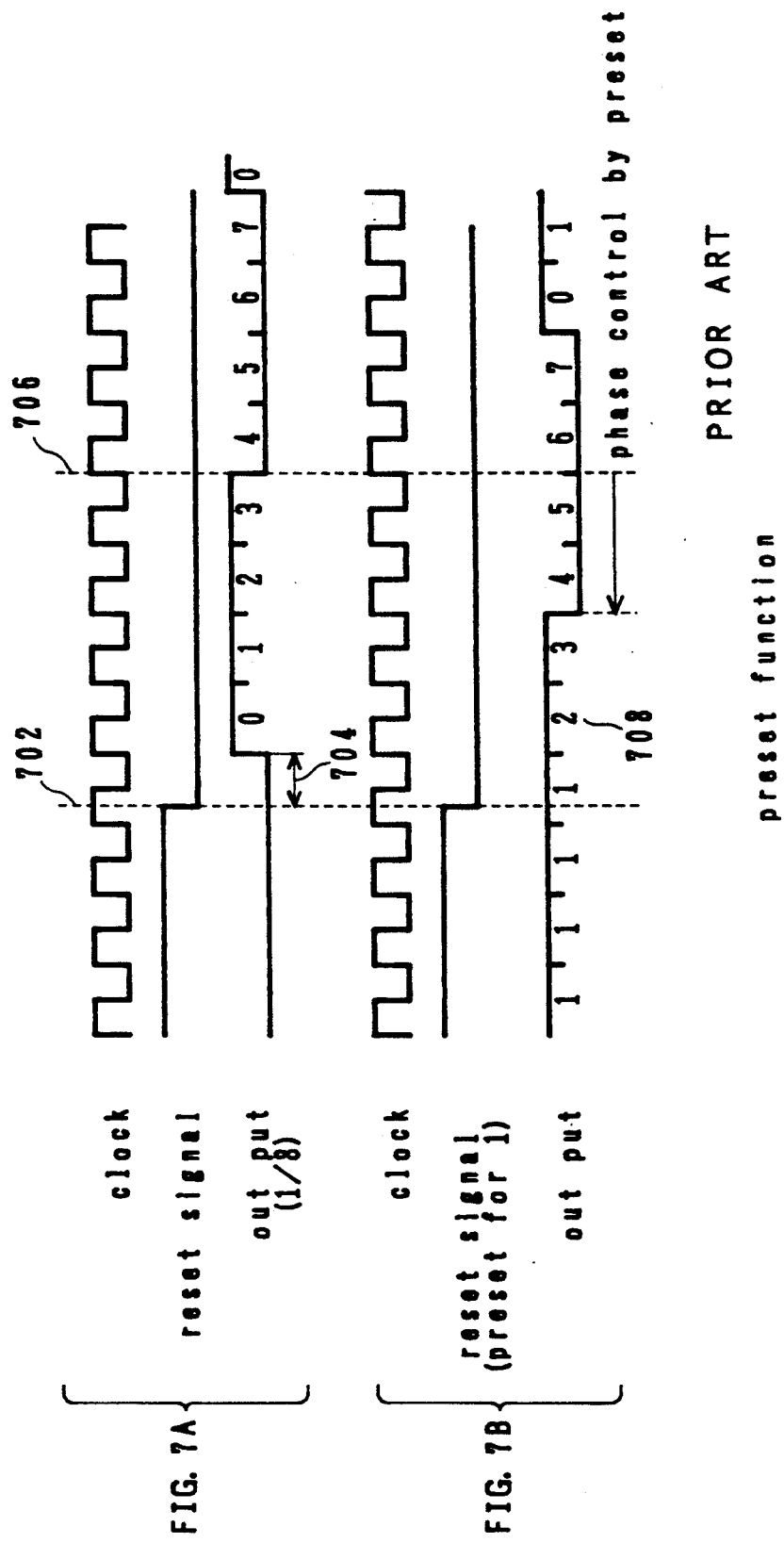
FIGS. 7A and 7B are timing charts to explain the preset function and compare the preset function with the reset function.

This programmable frequency divider can be used as frequency divider 2 of the frequency synthesizer shown in FIG. 1. The propagation delay caused by the gate circuit, beginning at detection of output signals of the reference oscillator 3 by the controller 8 and ending at reset of the circuit 2, generally of the order of several tens of nsecs, can be compensated. The initial phase of the pre-scaler and the programmable counter outputs can be adjusted in units of input clock cycles. This allows offsetting of the delay without the need for an analog delay circuit.

For instance, if it is assumed that the frequency of the voltage controlled oscillator is 1 GHz, the delay can be adjusted in units of 1 nsec. ($1/10^9$ Hz = $10^{-9}$ s = 1ns)

The aforementioned programmable frequency dividing circuit can be embodied using suitable digital ICs. Further, the whole system of the frequency synthesizer can be integrated with ICs.

As described in the foregoing statement, the programmable frequency divider circuit of the present invention can be most appropriately applied in frequency synthesizers. However, its usage is not limited to such frequency synthesizers. For instance, the programmable frequency divider of the present invention may be used in a prior art frequency synthesizer. Other applications are discussed below.

Figure 14:
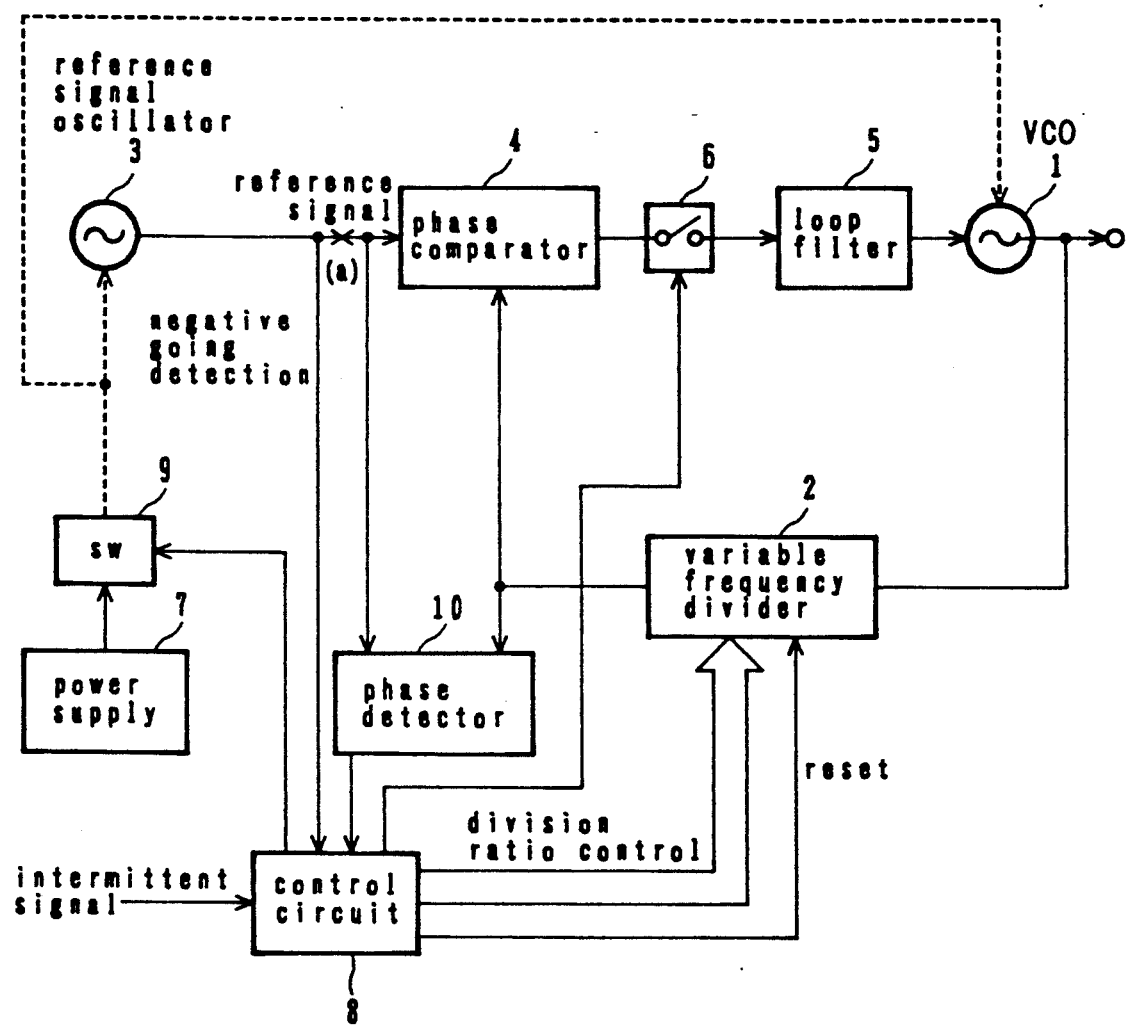
FIG. 14 is a block diagram of an embodiment frequency synthesizer of this invention.
Figure 15:
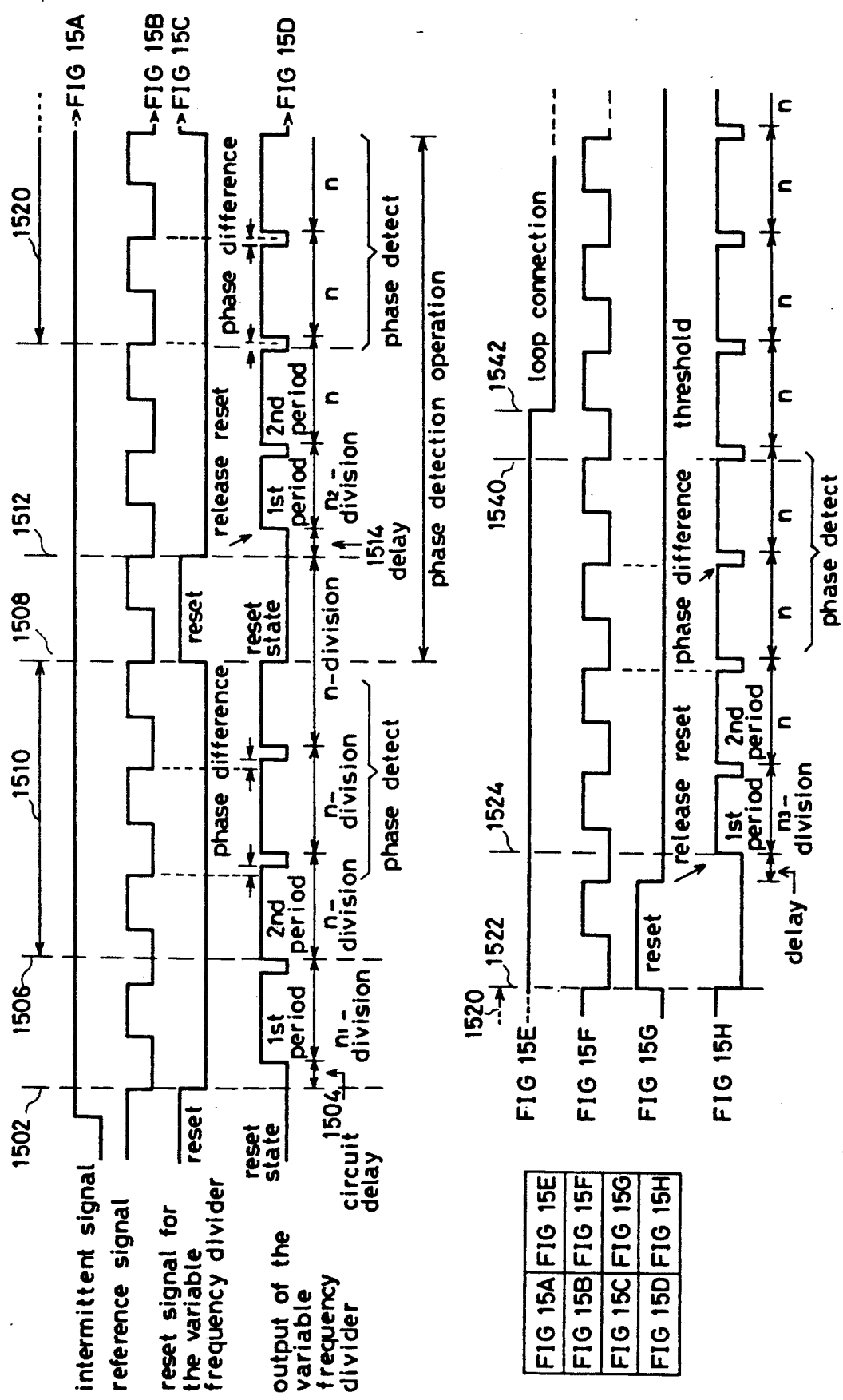
FIGS. 15A-15H are time charts to show examples of the operation of the embodiment of FIG. 14.

FIG. 14 is a block diagram of an embodiment of a frequency synthesizer according to this invention. This embodiment includes VCO 1, variable frequency divider 2, reference signal oscillator 3, phase comparator 4, loop filter 5, switch circuit 6, power source 7, control circuit 8, power switch 9 (SW), and phase detector 10.

The variable frequency divider 2 has a preset function, such that it can perform its dividing operation using a division value of n, only during the first cycle after the reset condition is released. A division value of N is used in the second cycle and thereafter. The phase detector 10 is a circuit which detects a phase difference between the output signals from the reference signal oscillator 3 and the output signals from the variable frequency divider 2.

FIGS. 15A–15H are time charts, with which the operation of the embodiment shown in FIG. 14 will be described.

When a loop is formed by closing the switch circuit 6 in the frequency synthesizer of this embodiment, the control voltage of VCO 1 is latched in loop filter 5. This control voltage is related to the oscillation signal frequency outputted from VCO 1. In order to latch the control voltage in loop filter 5, the voltage may be charged into filter 5 from outside or latched by opening the loop at the same time after the phase-locked loop has been formed.

Before closing the loop, the internal condition of the variable frequency divider 2 is reset to set the division ratio n at $n_1$ during the first phase difference detecting operation. The reset condition of the variable frequency divider 2 is released at time 1502, in response to a negative-going edge detected in the outputs of the reference signal oscillator 3. This initiates the dividing operation using the division ratio $n_1$, after a circuit delay 1504. This division ratio $n_1$ is maintained only for the first cycle until time 1506. Beginning at the second cycle at time 1506, the dividing operation is conducted with a dividing ratio of N for a certain period, labeled time 1510. The term "cycle" herein means a cycle of the output signals from variable frequency divider 2.

While conducting this dividing operation by division ratio N during time 1510, the phase detector 10 detects the difference in phase between the output from the reference signal oscillator 3 and the output from the variable frequency divider 2. If the phase difference becomes greater than or equal to a reference value at time 1510, the system is reset until time 1512. The division ratio n is reset to $n_1$ in the variable frequency divider after then resumed for the second time over a time period 1520.

The reset of variable frequency divider 2 causes a repeat of the phase detection operation of time 1510, however with a larger or smaller phase offset $n_2$. If the phase difference detection of time 1520 is still above the reference value even with division ratio $n_2$, then the system is reset at time 1522, and division ratio n is set at $n_3$, also larger or smaller than $n_2$ at time 1524, in order to repeat the operation.

The above operation is repeated until the phase difference between the output signals from the reference oscillator 3 and from the variable frequency divider 2 become smaller than one cycle of the VCO output signal. This occurs at time 1540 in FIGS. 15E–15H. Although FIGS. 15A–15H have been shown with only three cycles of detection, it can readily be appreciated by one having ordinary skill in the art that any number of cycles of such detection is possible. Switch circuit 6 is closed immediately after the final detection of the phase difference at time 1542 to form a closed circuit.

If a closed loop is formed immediately after the phase difference becomes less than one cycle of the input signals from the variable frequency divider 2 final detection, the fluctuation of the frequency will be minimized, thus enabling a stable phase-locked loop. The final division ratio (in the example $n_3$) is stored. In subsequent intermittent operation of the power source, the division ratio n of the variable frequency divider remains at the value of the final phase difference detection $n_3$, unless the phase difference output from the detector 10 becomes larger than the reference value, in which case the above operations are repeated.

Figure 16:
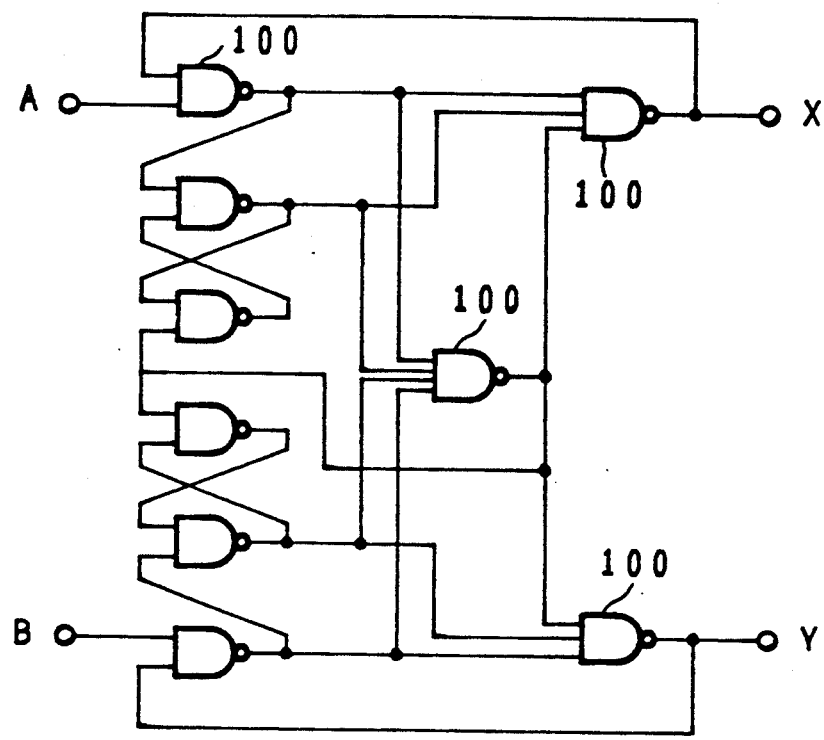
FIG. 16 is a chart to show an example of the structure of a phase difference detection circuit.

FIG. 16 is a circuit diagram of an embodiment of the phase difference detector 10. This circuit comprises nine AND circuits 100 which compare phases of the input signals A and B, to output a result. Time charts show this operation in FIGS. 17A and 17B.

Figure 17A:
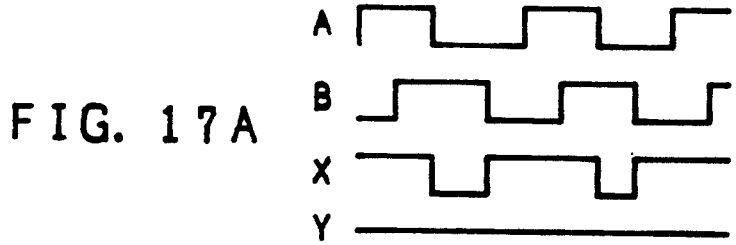
FIGS. 17A and 17B are charts to show the relation between input signals and output signals at the phase difference detection circuit.
Figure 17B:
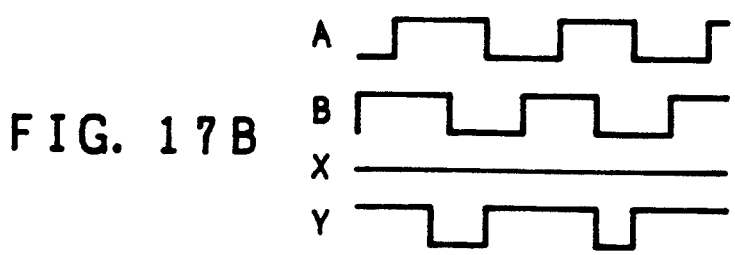

For instance, when the phase of an input signal A is advanced ahead of the input signal B as in FIG. 17A, an advance signal is outputted to a terminal X When the phase of the input signal A is behind the input signal B as in FIG. 17B, a delay signal is outputted to a terminal Y. When the phases of the signals A and B coincide, neither signal is issued.

This circuit can be used with the output signal from the reference signal oscillator 3 assumed to be an input signal A and the output signal from the variable frequency divider 2 assumed to be an input signal B. Then, the phase of the output signals of the variable frequency divider 2 can be detected whether ahead of or behind the phase of the output signals of the reference oscillator.

Therefore, this circuit can be used as the phase detector 10 shown in FIG. 14. When the phase of the output signal of the variable frequency divider 2 is determined to be ahead of the phase of the output signals from the oscillator 3 at the second phase difference detection, and the division ratio n of the variable frequency divider 2 has been set at $n_1$ at the first phase difference detection, a new division ratio $n_2$, which is larger than $n_1$ can be set as the division ratio. When the phase is determined to be behind, $n_2$ which is smaller than $n_1$, should be set as the division ratio n.

The division ratio n may be set by gradually increasing/decreasing its value, or by increasing the convergence speed of the division ratio n by changing the rate of change. In both cases, the values will be converged to one single value if the value n is controlled to be between the value $n_f$ showing the phase ahead and the value $n_j$ showing the phase behind. The actual phase difference at the time becomes less than one cycle of input signals of the variable frequency divider. It is eg. 1.3 nsec in a 800 MHz band frequency synthesizer.

Even if an allowable error of $\pm 1$ cycle of the VCO output signal is given to n in order to enhance the convergence, the phase difference will remain small enough so as to not generate significant frequency fluctuation. When a convergence test was conducted for the division ratio n using this phase difference detector, it was confirmed that the values converged to one single value.

Figure 18:
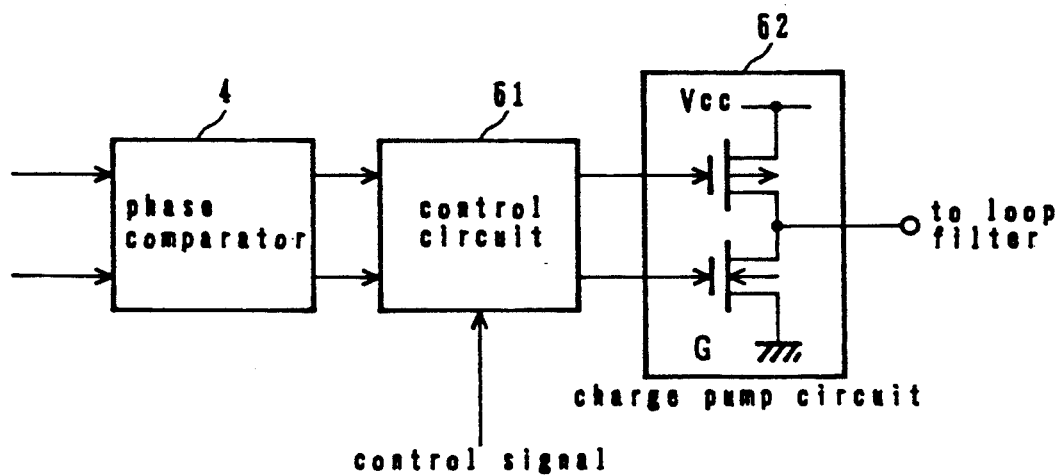
FIG. 18 is a view to show an embodiment of a switch circuit.
Figure 19:
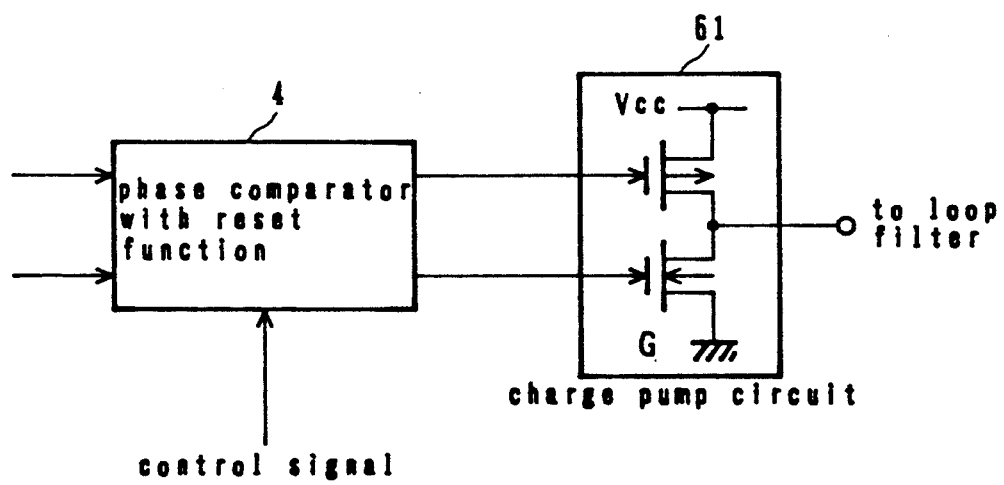
FIG. 19 is a view to show another embodiment of the switch circuit.

FIGS. 18 and 19 are block diagrams which show an embodiment of a switching circuit 6 which is provided with a charge pump circuit 62 to increase the impedance of the output.

A control circuit 61 is coupled between phase comparator 4 and a charge pump circuit 62 in FIG. 18. FIG. 19 shows a reset function provided within the the phase comparator 4 to reset the internal condition of phase comparator 4 so that the output signals therefrom can increase the impedance of the output from the charge pump circuit 62.

In order to confirm the operation of this embodiment, an intermittent operation test was conducted with an 800 MHz band frequency synthesizer.

FIGS. 20A and 20B will be used to explain the results of the test; the frequency fluctuation occurred when the power source of the variable frequency divider and of reference signal oscillator was intermittently connected in an intermittent PLL operation.

The results when this embodiment is not used are shown in FIG. 20A. The frequency in FIG. 20A fluctuates greatly with the on and off operation of power supply 9. In contrast, the use of this embodiment is shown in FIG. 20B, where almost no fluctuation of frequency occurs as the power supply turns on and off.

FIG. 21 shows an example of the operations where the power is supplied intermittently using the above embodiment.

When repeatedly switching the loop ON and OFF, switching circuit 6 is opened first, to latch the control voltage of VCO 1 in loop filter 5 immediately before opening the loop. For intermittent operation, the power source of the circuit should be turned OFF for a predetermined period. The phase difference detection described above is then repeatedly executed to set the division ratio n for the variable frequency divider before connecting the switch circuit 6 to close the loop. A similar operation is repeated in the subsequent switching of the loop to control the phase difference between the from reference oscillator 3 and the output output from variable frequency divider 2 to be constantly less than one cycle of the output signal of VCO 1.

The present invention is especially advantageous when a phase difference larger than one cycle of the output signal of VCO 1 is generated between the output signals from reference signal oscillator 3 and from programmable counter 23, due to fluctuations in temperature or voltage after the final n has been set to start such an intermittent operation. The present invention control can make the phase difference consistently less than one cycle of the output signal of VCO 1.

Although the description in the foregoing is related to the case where the phase difference is reduced only by controlling the division ratio, the same result may be attained by insertion of a delay circuit at the point (a) in FIG. 14, so that the reference signal to be supplied to the phase comparator 4 and the phase detector 10 are delayed behind the reference signal to be supplied to the control circuit 8'. For that purpose, a delay circuit suitable for the delay required by the control circuit 8' is attached at the time of fabrication so that the fluctuation in delay due to the fluctuation in temperature or electric voltage is offset by the control of the division ratio.

Although only a few exemplary embodiments of this invention have been described in detail above, those skilled in the art will readily appreciate that many modifications are possible in the exemplary embodiments without materially departing from the novel teachings and advantages of this invention.

Accordingly, all such modifications are intended to be included within the scope of this invention as defined in the following claims.

What is claimed is:

1. A frequency synthesizer comprising:
   a voltage controlled oscillator producing a frequency output which is responsive to an input control voltage;
   variable frequency divider means, coupled to receive said frequency output from said voltage controlled oscillator for dividing said frequency output by a supply division ratio n;

a reference signal oscillator for producing reference signals;

phase comparator means for comparing a phase of an output signal of said variable frequency divider means with a phase of said reference signal and producing a signal indicative thereof;

a controllable switch circuit, coupled to receive said signal, for selectively conducting said signal therethrough based on a switch control signal, a closed loop being formed by a closing of said controllable switch circuit;

loop filter means, coupled to an output of said controllable switch circuit, for smoothing and latching said output, and coupling the smoothed output to said voltage controlled oscillator as said control voltage;

phase detector means for detecting a phase difference between said output signal from said variable frequency divider means and said reference signal and producing an output phase difference signal; and control means for:
(1) initially setting $n_1$ as said division ratio n during a reset condition while maintaining said variable frequency divider means in a reset condition before closing the loop to initiate a first phase difference detection cycle;
(2) detecting an edge of said reference signal;
(3) releasing said reset condition of said variable frequency divider in response to said detecting to divide by said division ratio for a first cycle;
(4) setting N as a second division ratio after said first cycle;
(5) dividing by N during a second cycle;
(6) setting $n_2$ as a third division ratio based on said output phase difference signal;
(7) resetting said variable freqency divider means and repeating said functions (2), (3), (4), and (5) as a second phase difference detection cycle to repeat an operation similar to the first phase difference detection cycle using said division ratio $n_2$;
(8) repeating said function (7) using different division ratios until the phase difference between the output phase of said reference oscillator and the output phase form the variable frequency divider becomes smaller than the reference value; and
(9) commanding said switch circuit to close said loop.

2. A frequency synthesizer comprising:

a voltage controlled oscillator producing a frequency output which is responsive to an input control voltage;

variable frequency divider means, coupled to receive said frequency output form said voltage controlled oscillator for dividing said frequency output by a supply division ratio n;

a reference signal oscillator for producing reference signals;

phase comparator means for comparing a phase of an output signal of said variable frequency divider means with a phase of said reference signal and producing a signal indicative thereof;

a controllable switch circuit, coupled to receive said signal, for selectively conducting said signal therethrough based on a switch control signal, a closed loop being formed by a closing of said controllable switch circuit;

loop filter means, coupled to an output of said controllable switch circuit, for smoothing and latching said output, and coupling the smoothed output to said voltage controlled oscillator as said control voltage;

phase detector means for detecting a phase difference between said output signal from said variable frequency divider means and said reference signal and producing an output phase difference signal; and control means for:
(1) initially setting $n_1$ as said division ratio n during a reset condition while maintaining said variable frequency divider means in a reset condition before closing the loop to initiate a first phase difference detection cycle;
(2) detecting an edge of said reference signal;
(3) releasing said reset condition of said variable frequency divider means in response to said detecting to divide by said division ratio for a first cycle;
(4) setting N as a second division ratio $n_2$ after said first cycle; and
(5) dividing by N during a second and subsequent cycles.

3. A synthesizer as in claim 2 wherein said control means is also for: (6) setting $n_3$, $n_4$ ... during third and subsequent cycles as third and subsequent division ratios, and repeating said functions (2), (3), (4) and (5) as subsequent phase difference detection cycles to repeat an operation similar to the first phase difference detection cycle using said third and subsequent division ratios.

* * * * *